United States Patent [19]

Simpson

[11] Patent Number: 5,016,020
[45] Date of Patent: May 14, 1991

[54] TRANSCEIVER TESTING APPARATUS

[75] Inventor: Iain F. Simpson, Fife, United Kingdom

[73] Assignee: The Marconi Company Limited, England

[21] Appl. No.: 340,436

[22] Filed: Apr. 19, 1989

[30] Foreign Application Priority Data

Apr. 25, 1988 [GB] United Kingdom ................. 8809688

[51] Int. Cl.$^5$ ............................................. G01R 27/00
[52] U.S. Cl. ..................................................... 343/703
[58] Field of Search ............. 343/702, 703; 174/35 R, 174/35 MS

[56] References Cited

U.S. PATENT DOCUMENTS

| | | | |
|---|---|---|---|
| 2,490,782 | 12/1949 | Collup | 343/703 |
| 2,988,740 | 6/1961 | Albanese | 343/703 |
| 4,220,955 | 9/1980 | Frye | 343/703 |
| 4,794,396 | 12/1988 | Pothier | 343/703 |

OTHER PUBLICATIONS

Czerwinski, W. P. et al., A Compact Tubular Chamber for Impedance and Power Testing of VHF Whip Antennas, IEE Transactions on Vehicular Technology, vol. VT-21, No. 3, 8-1972.

*Primary Examiner*—Michael C. Wimer
*Assistant Examiner*—Peter Toby Brown
*Attorney, Agent, or Firm*—Kirschstein, Ottinger, Israel & Schiffmiller

[57] ABSTRACT

Apparatus for testing a radio transceiver installation having an antenna includes a screening hood (20) adapted to be fitted over the antenna (10) of an installation to be tested; and a hood antenna (21) mounted within said hood (20) so that when the hood is in its operative position the two antennae (10, 21) form an over-coupled bandpass filter. The position of said hood antenna (21) is within adjustable hood (20) which should normally have a diameter which is approximately 0.15 wavelengths of the resonant frequency of an antenna (10) to be tested.

7 Claims, 2 Drawing Sheets

TRANSCEIVER TESTING APPARATUS

BACKGROUND OF THE INVENTION

1. Field of the Invention

The present invention concerns apparatus for testing complete radio transceiver installations and particularly installations which are carried in vehicles.

2. Description of Related Art

At present such testing involves disconnection and testing each item of the installation independently. The problems which have prevented the implementation of a technique for end-to-end testing of a complete installation in situ are as follows:

(a) the effects of the impedance match between the transceiver and its antenna when a coupling mechanism is introduced into the near field of the antenna;

(b) the repeatability and loss of coupling between the vehicle antenna and a test system; and (c) the effects of external signals.

SUMMARY OF THE INVENTION

The present invention has for an object the provision of apparatus which meets the above problems and permits end-to-end testing of complete radio transceiver installations in situ.

Accordingly, from a first aspect the present invention consists of an apparatus for testing a radio transceiver installation comprising a hood adapted to be fitted over the antenna of an installation to be tested, an antenna mounted within the hood so that when the hood is in its operative position the two antennae form an over-coupled bandpass filter.

From a second aspect the invention consists of a method of testing a radio transceiver installation having a resonant antenna comprising placing a hood over the antenna of the installation to be tested, the hood containing a second resonant antenna so that the two antennae form an over-coupled bandpass filter, and carrying out tests on the transceiver installation via the second antenna.

BRIEF DESCRIPTION OF THE DRAWINGS

In order that the present invention may be more readily understood, and embodiment thereof will now be described by way of example and with reference to the accompanyng drawings, in which.

DETAILED DESCRIPTION OF THE PREFERRED EMBODIMENTS

Figure 1:
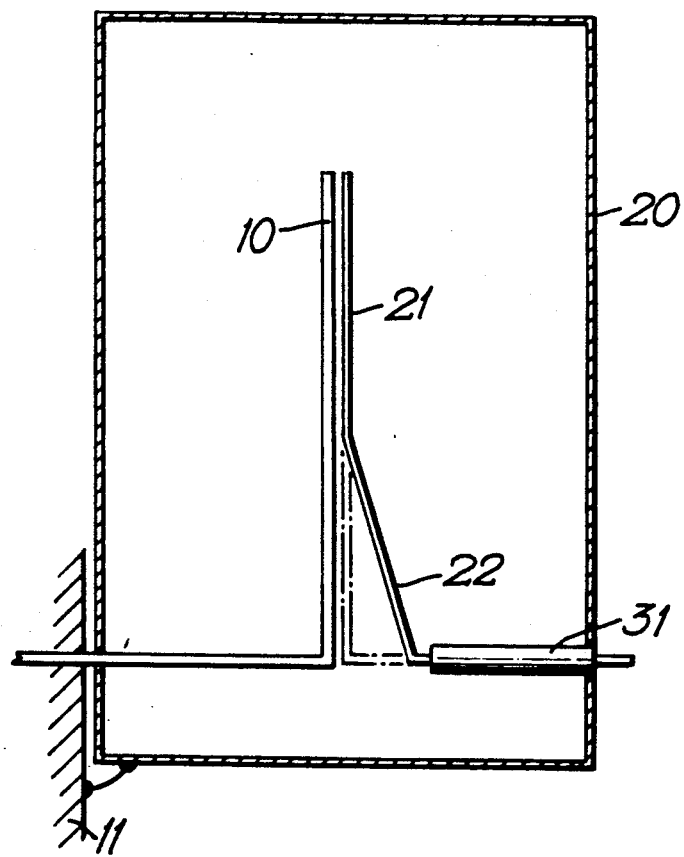
FIG. 1 is a section through an embodiment of radio transceiver test apparatus according to the present invention.

Referring now to FIG. 1 of the accompanying drawings this shows a vehicle antenna 10 extending from part 11 of a vehicle. The antenna 10 leads to a conventional radio transceiver installation which is not shown.

The test apparatus comprises a hood 20 which is an earthed screening hood. The hood 20 is made from aluminum coated with a conductive finish which may be chrome based. It is important that the actual material of the hood be non-magnetic. As it is likely that the hood will be used in conjunction with metallic vehicles, earthing will normally be achieved by simple contact between the hood and the vehicle when the former is placed over an antenna. The size of this hood 20 is so chosen that it is non-resonant at the operational frequency of the antenna 10. The effect of placing the hood 20 alone over the antenna 10 would be to move the resonance of antenna 10 down in frequency from its operational frequency. However, mounted within hood 20 is a second antenna similar to antenna 10 but having a higher resonant frequency. The arrangement of hood 20 and second antenna 21 is such that when the hood is fitted over antenna 10 the two antennae 10, 21 form an over-coupled bandpass filter. The higher frequency pole of the filter so formed is then set at the original operational frequency of antenna 10. In the present embodiment this is achieved by moving a lower part 22 of antenna 21 towards or away from antenna 10. This can be done by any suitable mechanism.

Figure 2:
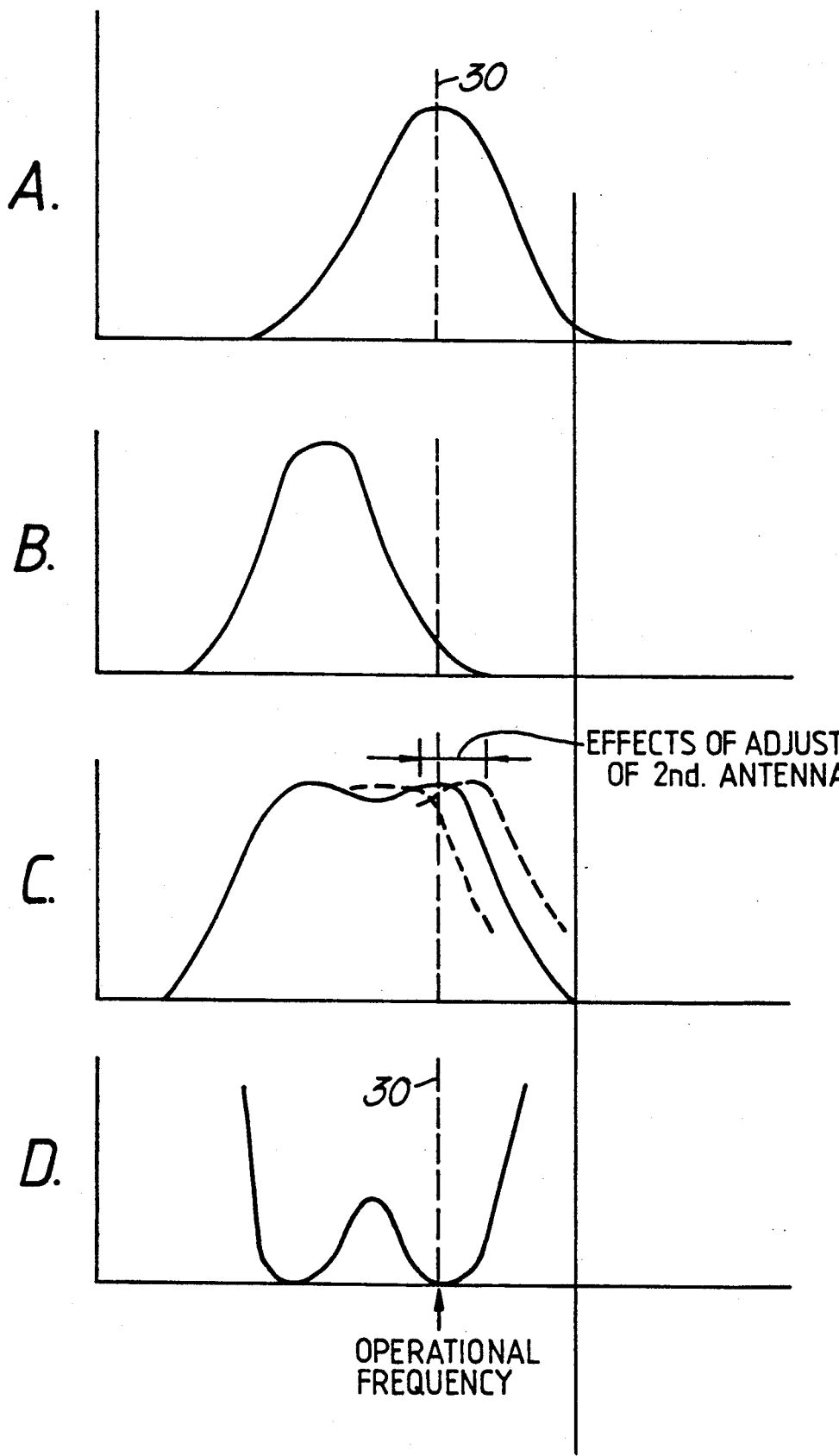
FIG. 2 is a series of response curves relating to the testing of a radio transceiver installation.

Referring now to FIG. 2 of the drawings, shown at A is the original antenna response with the operational frequency marked by the dotted line 30.

Curve B shows the effect of placing the hood 20 over antenna 10. As can be seen the operational frequency has been shifted downwardly.

The effect of antenna 21 being coupled to antenna 10 is shown in curve C. It can be seen that Curve C now has two poles which are set symmetrically about a frequency lower than the original operational frequency of antenna 10. The arrows and dotted curves show the effects of the adjustment of antenna 21.

FIG. 1 of the drawings shows a second method of adjusting the effect of the second antenna on the installation being tested. The lower end of antenna 21 carries a screen 31 for adjusting the effective length of the antenna. Movement of the screen, in turn, varies the operational frequency of antenna 21.

In order to use the test equipment, the second antenna 21 and screen 31 are adjusted to give optimum results with regard to a particular type of installation to be tested. Essentially this means setting the second antenna and its screen in such a manner that the higher frequency pole of the over-coupled bandpass filter formed by the two adjacent antennae is substantially coincident with the original operating frequency of antenna 10.

With the apparatus just described, the VSWR (Voltage Standing Wave Ratio) seen on the connector to the antenna 10, i.e. curve D, has been measured at better than 1.5/1 for approximately 7% bandwidth and better than 2/1 for approximately 10% bandwidth at the operational frequency when the second antenna is terminated with 50 ohms. The hood 20 has been found to reduce the effects of external signals by over 30 dB.

For use with a particular type of resonant antenna, the hood 20 could typically have a diameter of 0.15 wavelengths. Fitting the hood over that antenna would lower its resonant frequency (see FIG. 2B). The second antenna 21 should have a higher resonant frequency than that of the original antenna 10. Once the second antenna has been adjusted, either by movement or by alteration of its screen length to give the required result when the hood is fitted over a sample test antenna, the components are fixed in position and the hood and second antenna can be used for the testing of other similar radio transceivers.

During testing, the second antenna is connected by a line to conventional test equipment for testing the various parameters of the radio transceiver being tested. As this test equipment is entirely conventional, it has not been shown.

It is possible that once the correct set up of the test antenna 21 within hood 20 has been obtained, the hood can be filled with a substance such as polystyrene foam. Any other mechanical method of ensuring that the components can be fixed in their correct places can be used provided that it does not affect the performance of the system.

I claim:

1. Apparatus for testing a radio transceiver installation having an installation antenna that normally resonates at a resonant frequency, the apparatus comprising:
   (a) a grounded hood mounted on the installation and surrounding the installation antenna in a test mode, said hood being dimensioned to be non-resonant at the resonant frequency of the installation antenna, thereby lowering the resonant frequency of the installation antenna when the hood alone surrounds the installation antenna;
   (b) a hood antenna that normally resonates at a higher resonant frequency greater than said resonant frequency of the installation antenna, said hood antenna being mounted within the hood and being coupled to the installation antenna in the test mode to form an over-coupled bandpass filter having lower and higher frequency poles; and
   (c) means to adjust the higher frequency pole of the filter to be substantially coincident with said resonant frequency of the installation antenna in the test mode by varying said higher resonant frequency of the hood antenna.

2. Apparatus as claimed in claim 1, wherein the hood antenna has a movable part adjacent the installation antenna, and wherein said movable part is moved relative to the installation antenna.

3. Apparatus as claimed in claim 1, wherein the hood antenna has a radiating length, and wherein the adjusting means is a movable screen to adjust the radiating length of the hood antenna.

4. Apparatus as claimed in claim 1, wherein the hood is constituted of a non-magnetic material.

5. Apparatus as claimed in claim 4, wherein the hood is constituted of aluminum treated with a conductive finish.

6. Apparatus as claimed in claim 1, wherein the hood is filled with an electro-magnetically inert substance.

7. Apparatus as claimed in claim 1, wherein the hood is dimensioned to have a diameter which is approximately 0.15 wavelengths of said resonant frequency of the installation antenna.

* * * * *